United States Patent
Hirose et al.

(10) Patent No.: US 8,258,475 B2
(45) Date of Patent: Sep. 4, 2012

(54) CHARGED PARTICLE RADIATION DEVICE PROVIDED WITH ABERRATION CORRECTOR

(75) Inventors: Kotoko Hirose, Matsudo (JP); Takeshi Kawasaki, Musashino (JP); Tomonori Nakano, Kodaira (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/143,965

(22) PCT Filed: Jan. 14, 2010

(86) PCT No.: PCT/JP2010/000173
§ 371 (c)(1),
(2), (4) Date: Jul. 11, 2011

(87) PCT Pub. No.: WO2010/082489
PCT Pub. Date: Jul. 22, 2010

(65) Prior Publication Data
US 2011/0272578 A1 Nov. 10, 2011

(30) Foreign Application Priority Data
Jan. 19, 2009 (JP) .................................. 2009-008876

(51) Int. Cl.
*H01J 37/28* (2006.01)
*H01J 37/304* (2006.01)
*G01N 23/225* (2006.01)

(52) U.S. Cl. ..... 250/310; 250/306; 250/311; 250/366 R; 250/492.2

(58) Field of Classification Search .................. 250/310, 250/311, 306, 396 R, 492.2
See application file for complete search history.

(56) References Cited

U.S. PATENT DOCUMENTS

| | | | |
|---|---|---|---|
| 7,462,828 B2 * | 12/2008 | Fukada et al. | 250/310 |
| 7,714,286 B2 * | 5/2010 | Nakano et al. | 250/310 |
| 7,834,326 B2 * | 11/2010 | Kawasaki et al. | 250/396 ML |
| 7,915,582 B2 | 3/2011 | Hirose et al. | |
| 8,129,680 B2 * | 3/2012 | Hirose et al. | 250/307 |
| 8,153,969 B2 * | 4/2012 | Fukada et al. | 250/311 |
| 2001/0050338 A1 | 12/2001 | Nomura | |
| 2003/0006371 A1 | 1/2003 | Watanabe et al. | |
| 2005/0072920 A1 | 4/2005 | Inada | |
| 2006/0169895 A1 | 8/2006 | Honda et al. | |
| 2007/0158567 A1 | 7/2007 | Nakamura et al. | |
| 2009/0212228 A1 | 8/2009 | Hirose et al. | |

FOREIGN PATENT DOCUMENTS

| | | |
|---|---|---|
| JP | 2000182555 | 6/2000 |
| JP | 2001357811 | 12/2001 |

(Continued)

OTHER PUBLICATIONS

Uhlemann et al., "Residual wave aberrations in the first spherical aberration corrected transmission electron microscope", Ultramicroscopy 72, 1998, pp. 109-119.

*Primary Examiner* — Nikita Wells
(74) *Attorney, Agent, or Firm* — Mattingly & Malur, PC

(57) ABSTRACT

There is provided a charged particle radiation device provided with an aberration corrector capable of correcting aberration with high precision in a short time by automatically setting an aberration coefficient measuring condition to thereby realize measurement with high precision. The charged particle radiation device has a feature that a value of defocus and a value of astigma, occurring owing to aberration at the time of the beam tilting, are estimated on the basis of results of aberration measurement, thereby adjusting an electron optical system on the basis of these values.

20 Claims, 14 Drawing Sheets

FOREIGN PATENT DOCUMENTS

| | | |
|---|---|---|
| JP | 2003016983 | 1/2003 |
| JP | 2005108567 | 4/2005 |
| JP | 2006140119 | 6/2006 |
| JP | 2007173132 | 7/2007 |
| JP | 2008159286 | 7/2008 |
| JP | 2009199904 | 3/2009 |

* cited by examiner

FIG. 6
A,B,C.... → SHOOTING POSITION IN AZIMUTH ANGLER DIRECTION
①,②,③.... → SHOOTING POSITION IN FOCUS VARIATION DIRECTION
(a)
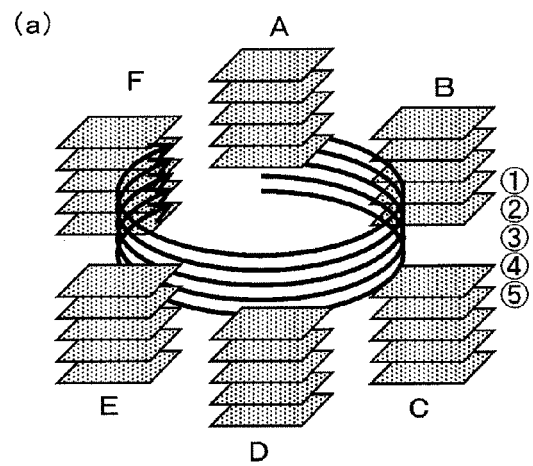
(b)
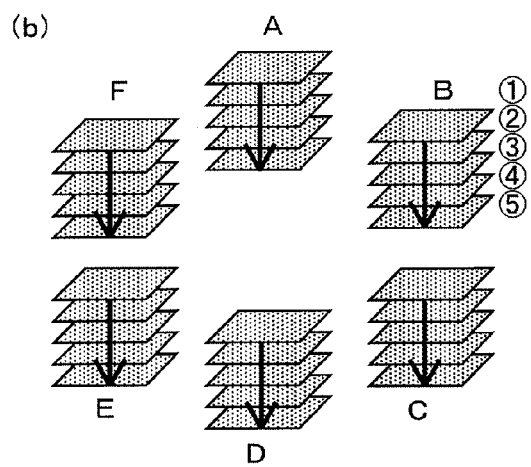
(c)
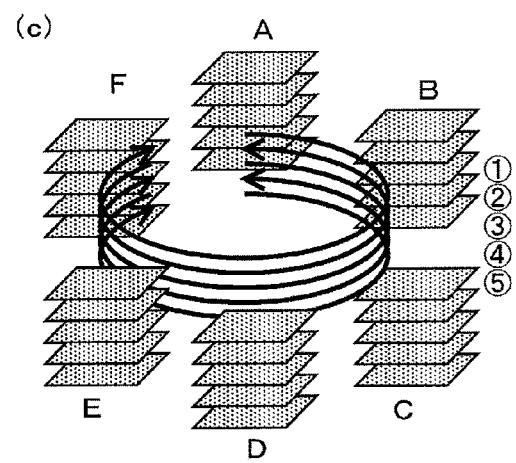

| -1 | 0 | 1 |
|----|---|---|
| -2 | 0 | 2 |
| -1 | 0 | 1 |

0° DIRECTION (b)

| -1 | -1 | 0 |
|----|----|---|
| -1 | 0  | 1 |
| 0  | 1  | 1 |

45° DIRECTION (c)

| -1 | -2 | -1 |
|----|----|----|
| 0  | 0  | 0  |
| 1  | 2  | 1  |

90° DIRECTION (d)

| 0 | -1 | -1 |
|---|----|----|
| 1 | 0  | -1 |
| 1 | 1  | 0  |

135° DIRECTION

FIG. 10
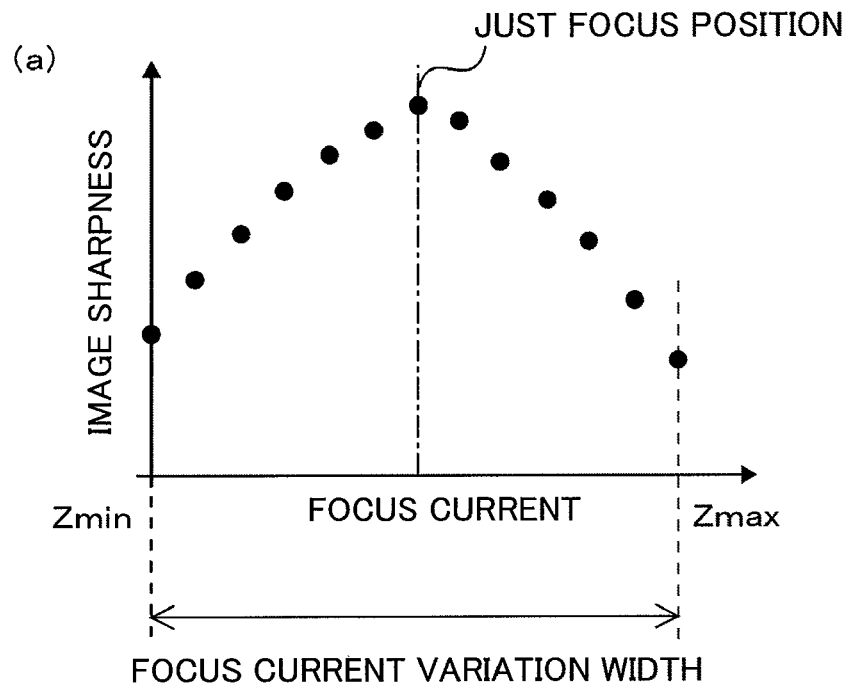
(a)
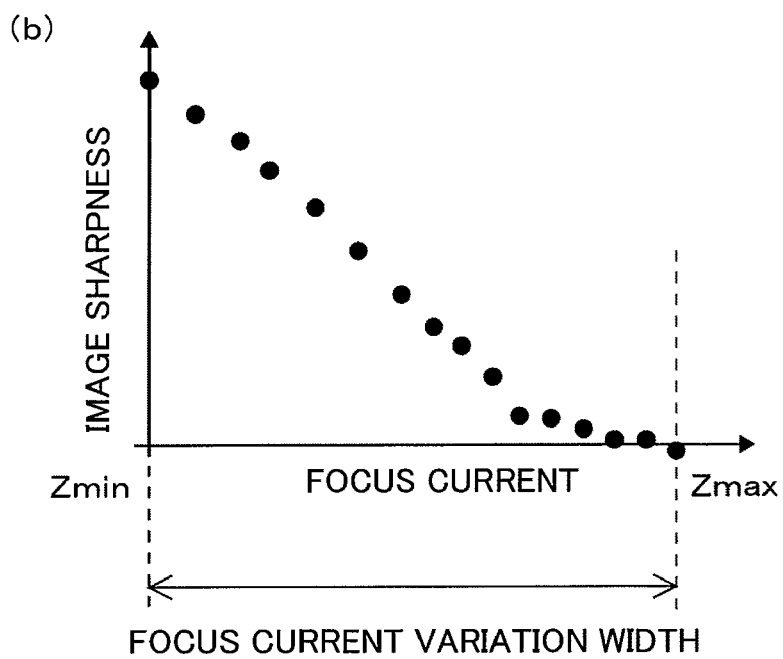
(b)

CHARGED PARTICLE RADIATION DEVICE PROVIDED WITH ABERRATION CORRECTOR

TECHNICAL FIELD

The present invention relates to a charged particle radiation device provided with an aberration corrector, and in particular, to a scanning charged particle radiation device such as a scanning electron microscope (SEM), a scanning transmission electron microscope (STEM), and so forth, provided with a higher-order aberration corrector capable of correcting aberration of so-called high-order such as third-order, fifth-order, and so forth.

BACKGROUND ART

With a device using a convergent charged particle beam (probe beam), such as the scanning electron microscope (SEM), an ion beam machining device (FIB), and so forth, an observation of image or machining of a specimen is executed by causing a probe to scan over the specimen. In the case of those charged particle radiation devices, resolution or machining accuracy is dependent on a size of the probe in section (a probe diameter), so that the smaller the probe diameter is, the higher the resolution, or the machining accuracy, can be, in theory, enhanced.

Progress has lately been made in development of an aberration corrector for use in a convergent charged particle beam applied device, leading to progress in commercialization of the aberration corrector. With the aberration corrector, rotationally asymmetrical electric field and magnetic field are applied to a beam by use of a multipole lens, thereby giving reverse aberration to a probe beam. By so doing, it is possible to cancel out various types of aberrations including spherical aberration, and chromatic aberration, occurring to an objective lens, a deflection lens, and so forth, in an optical system.

With the optical system of a conventional convergent charged particle beam applied device, axially rotational symmetry lenses are used, and if the optical axes of the respective lenses are aligned with axes of the respective lenses, and astigma as well as focus of the objective lens is adjusted, it is, in theory, possible to adjust the probe diameter so as to be at the minimum value. Further, at the time of executing focus adjustment and astigma correction, images of the probe have been obtained under varied focus conditions, and while comparing the respective images in at least two directions with each other in respect of sharpness, adjustment has been made by selecting the sharpness at the highest point.

On the other hand, in the case of a convergent charged particle beam applied device provided with an aberration corrector, the rotationally asymmetrical electric field and magnetic field are applied by the aberration corrector using a multipole lens. By so doing, with those convergent charged particle beam applied devices, influence of the higher-order aberration becomes prominent while the conventional rotationally symmetrical optical system has no such influence. In order to make the most of the performance of the convergent charged particle beam applied device, it is necessary to find out types of aberrations contained in the beam (aberration components), including those aberrations described as above, and to make accurate measurement on respective amounts of the aberration components, thereby removing all the aberration components by adequately adjusting the aberration corrector.

As one of methods for such a purpose, there is available a method whereby an electron beam falling on a specimen is tilted to get an image, and defocus as well as astigma of the image is measured to thereby find aberrations contained in the beam at the time when the beam is not tilted. In, for example, Non Patent document 1, and so forth, there has been disclosed the principle behind this method with reference to a transmission electron microscope (TEM). More specifically, in the case of the TEM, a method is adopted whereby a ring pattern appearing by Fourier transformation of an image of a specimen of an amorphous structure is analyzed to thereby find defocus and astigma. However, with a convergent charged particle radiation device, it is not possible to get an image having information on such a ring pattern as obtained in the TEM, the method as it is cannot be applied thereto. In order to apply this principle to the convergent charged particle radiation device, there is the need for another technique for measuring defocus, and astigma.

Meanwhile, as one of potent means for measuring defocus, and astigma in the case of the convergent charged particle radiation device, there is available a method whereby an image is obtained at plural focus positions, sharpness of the respective images on a direction-by-direction basis is evaluated, and defocus and astigma are evaluated on the basis of a peak value of the sharpness. This technique has already been known from Patent document 1, and so forth, as a method for automatic focus adjustment, and a method for automatic astigma correction in the case of the charged particle radiation device.

Further, in Patent document 2, there has been disclosed a method whereby evaluation means with varying detection accuracy of focus position are provided, and automatic focusing is carried out by combination of two different evaluation values. Still further, in Patent document 3, there has been disclosed an automatic astigma adjustment method whereby image sharpness is calculated, and an adequate astigma correction direction is selected from an image sharpness angular component value, thereby performing astigma correction.

PRIOR ART DOCUMENTS

Patent document

Patent document 1: JP-A-2003-16983
Patent document 2: JP-A-2000-182555
Patent document 3: JP-A-2005-108567

Non Patent Document

Non Patent document 1: "Residual wave aberrations in the first spherical aberration corrected transmission electron microscope" by Uhleman S., Haider M., Ultramicroscopy 72 (1998), pp. 109-119

SUMMARY OF THE INVENTION

Problems to be solved by the Invention

However, if an attempt is made to apply respective values of astigma, and defocus at the time of beam tilting for measurement of aberrations to measurement of aberrations in the case of the convergent charged particle radiation device, the following problem has been encountered.

In the case of aberration correction executed by use of the aberration corrector of the charged particle radiation device, it is intended to reduce spherical aberration, as a main target for the correction, to a range of 1/1000 to on the order of 1/10,000 of that prior to the correction. Respective values of astigma and defocus, caused by beam tilting, similarly undergo a change along with reduction in spherical aberration during this period. Resolution of aberration measurement is dependent on measuring resolution of the astigma and the defocus at the time of the beam tilting, and this is dependent on a focal interval at the time of measuring the astigma and the defocus.

More specifically, if a focal interval L is large as shown in FIG. 13 (*a*), search precision of a focus position where image sharpness is at the peak will deteriorate as compared with the case where the focal interval L is small as shown in FIG. 13 (*b*). Accordingly, it is not rational in terms of speed as well as measuring accuracy to carry out a measurement on the astigma and the defocus, caused by beam tilting, at a constant measuring resolution throughout execution of the aberration correction from the start of the correction to completion thereof to thereby find aberration coefficient. That is, in the case of large aberration, if measurement is carried out at all times under such a measuring condition as to enable the optimum measuring resolution to be obtained, it will become impossible to detect aberration through measurement even though correction has not been completed as yet when progress is made in aberration correction, and aberration has decreased, so that further correction can no longer be executed. On the other hand, if the measuring resolution is rendered smaller from the start of the correction, a multitude of images will be required in order to secure an aberration search range (a range of variation in the focus position) for measuring large aberration. This will cause a problem of an increase in measurement time.

Further, magnitude of the astigma caused by beam tilting is dependent on not only magnitude of aberration with the beam in as-non-tilt state but also a beam tilt angle. Accordingly, even only if the beam is slightly tilted during large aberration, an image will be significantly defocused. As a result, image sharpness will undergo an abrupt change in the vicinity of its peak, as shown in FIG. 14, which will invite measuring resolution insufficiency in the vicinity of the peak, and an increase in lower-end data unnecessary for searching the peak.

For reasons described as above, at the time of aberration measurement in the case of the convergent charged particle radiation device, it is necessary to set an adequate tilt angle, and an adequate aberration search condition (a variation width of the focus position and a variation range thereof), according to progress made in aberration correction, in the measuring condition.

In the case of the convergent charged particle radiation device described as above, the measuring condition accompanying the progress made in aberration correction has thus far been set, and determined by an operator as appropriate. This procedure, however, has largely relied on the operator's experience and expertise, and as such, has not been reliable. Accordingly, there has existed a problem in that, for example, an aberration search range excessively narrow against the magnitude of aberration is adopted, the peak value of image sharpness does not exist within the aberration search range, and the peak, therefore, cannot be found out, thereby rendering it impossible to evaluate the defocus, or the astigma, caused by beam tilting, to be at an adequate value, and resulting in failure to correctly estimate the aberration of an optical system.

Further, a measuring method for rendering higher accuracy compatible with higher speed at the time of measuring defocus and astigma, or setting of a measuring condition for realizing such a measuring method are known, as a function for the automatic focus adjustment or the automatic astigmatic adjustment. For example, in Patent document 2, higher accuracy of automatic focusing is aimed at by combination of two different evaluation values. With this method, however, in order to find the two evaluation values, measurement need be executed twice for every measurement, and the method is not practical because there will be an increase in the number of measurements in the case where a focus measurement is executed at plural points for every measurement as in the case of aberration measurement.

Further, in Patent document 3, astigmatic difference is estimated from a distance between the peaks of the image sharpness, for carrying out automatic astigmatic adjustment, thereby determining an astigma search range. However, in this case, there is the need for pre-measurement in order to estimate the astigmatic difference. In the case of aberration measurement, since the measurement of the defocus and the astigma, caused by beam tilting, represents an operation for eventually determining parameters for finding aberration coefficient with the beam in as non-tilt state, it is necessary to hold back the number of counts of those measurements to a minimum in order to effect rapid aberration correction.

Furthermore, since any of those methods described in the foregoing is not predicated on a tilted beam, and as such, cannot be used for adjustment of the tilt angle in the case of the convergent charged particle radiation device.

On the basis of the description as above, the problems to be solved by the present invention are summed up as follows.

A first problem to be solved by the present invention is to set an adequate tilt angle and an adequate focus-search condition, according to a scale of aberration, at the time of measuring aberration in order to determine an aberration correction amount in a convergent charged particle radiation device provided with an aberration corrector, thereby enabling aberration measurement to be executed with high precision.

A second problem to be solved by the present invention is to reduce loss in time, due to image shooting at the time of measuring aberration in order to determine an aberration correction amount in a convergent charged particle radiation device provided with an aberration corrector, thereby aiming at shorter time for measurement.

Means of Solving the Problems

A representative embodiment of the present invention is described as follows:

The invention provides in its one aspect a charged particle radiation device comprising:
a charged particle optical system including an aberration corrector;
a control means of the charged particle optical system; and
an information processing unit,
wherein the information processing unit generates an aberration correction signal of the aberration corrector to be outputted, captures a plurality of images by causing a beam to scan over a specimen, both a tilt angle and an azimuth angle of the beam being varied, measures an astigmatic difference, an angle, and defocus with respect to the plurality of the images captured, evaluates an aberration amount from these values, and feeds back the evaluated aberration amount to a correction signal amount of the aberration corrector and a control amount of the control means at the time of the next evaluation, respectively, thereby the information processing unit repeats the aberration correction until the evaluated aberration amount reaches a preset target value.

Effects of Invention

With the present invention, aberration can be always measured under the best condition suited to a state of aberration varying according to a correction state, thereby enhancing measurement precision. As a result, enhancement in correction accuracy can be expected in the case of correcting high order aberration

BRIEF DESCRIPTION OF DRAWINGS

FIG. 6 is a view depicting an image shooting order according to the first embodiment of the invention.

FIG. 7 is view showing the case of using a Sobel filter according to the first embodiment.

FIG. 10 is a view showing distribution of directional sharpness of images each containing astigma.

MODE FOR CARRYING OUT THE INVENTION

The present invention provides the following means to solve the problem, in order to render factors contradicting each other, that is, to render higher speed while higher precision in aberration measurement.

More specifically, with the present invention, in order to enable aberration measurement to be realized with high precision, an adequate tilt angle and an adequate focus-search condition, according to magnitude of aberration, are set at the time of aberration correction. By referring to results of preceding aberration measurements, in particular, the best aberration-measuring condition for the next measurement is determined.

Further, with the present invention, in order to reduce time loss and to aim at shorter measurement time as a result of getting an image, at the time of aberration measurement for determining an aberration correction amount, there is adopted an adjustment method whereby the number of counts of focus position adjustments as performed in a convergent charged particle radiation device is reduced to a minimum, at the time of getting plural images at plural focus positions.

Embodiments of the present invention are described hereinafter with reference to the accompanying drawings. Techniques described with reference to the embodiments of the present invention are applicable to the scanning electron microscope (SEM), the scanning transmission electron microscope (STEM), and so forth, and also applicable to a focusing ion beam machining device (FIB).

First Embodiment

A first embodiment of the present invention is described with reference to FIGS. 1 to 10. With the present embodiment of the present invention, there is described in detail an embodiment of a scanning electron microscope (SEM) provided with an electromagnetic field superimposed aberration corrector of 4 to 8 poles type. The aberration corrector according to the present embodiment is provided with multipole lenses in a plurality of stages, and is capable of executing high-order aberration correction. Further, the scanning electron microscope according to the present embodiment has a feature in that an SEM image is obtained by use of a standard specimen provided with a step, and aberration coefficient is worked out by use of the SEM image of the standard specimen.

Figure 1:
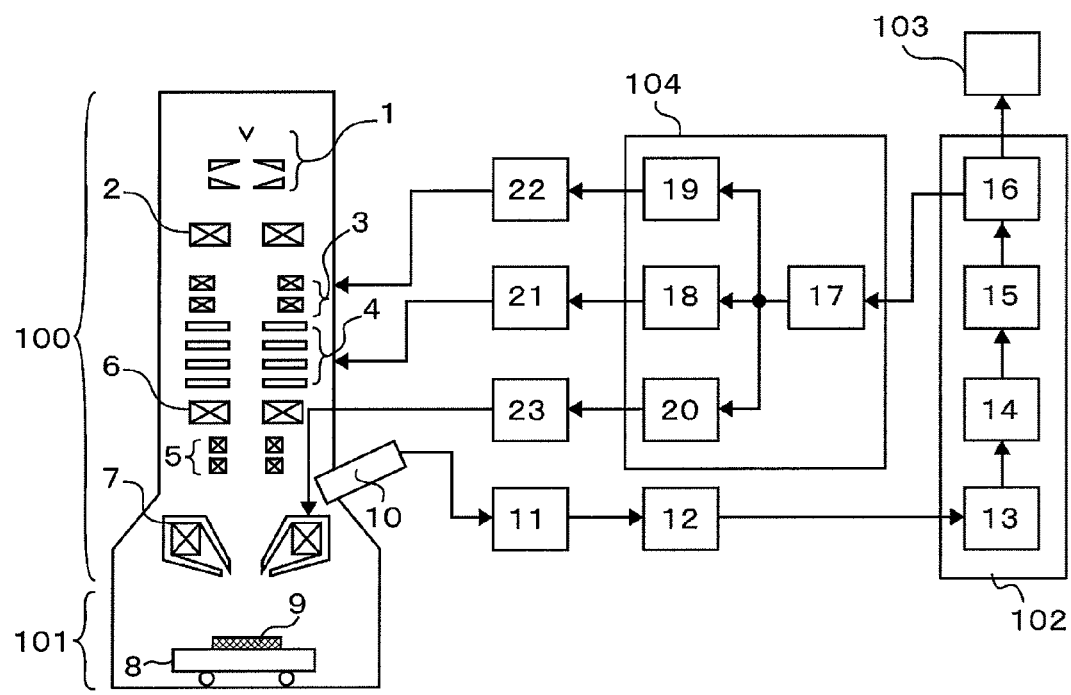
FIG. 1 is a system block diagram of a first embodiment of an SEM according to the present invention.

FIG. 1 broadly shows a system configuration of an SEM according to the present embodiment. As shown in FIG. 1, the SEM comprises a specimen chamber 101 including a specimen table 8 installed on a stage, for holding a specimen 9, a column 100 provided with a charged particle optical system for irradiating the specimen 9 with an electron beam (a primary charged particle beam), and detecting a secondary electron generated, or a reflection electron (a secondary charged particle), thereby outputting detection results as a secondary charged particle signal, a control means (not shown) of the charged particle optical system, and an information processing unit for processing the secondary charged particle signal outputted while controlling the charged particle optical system, thereby obtaining two-dimensional distribution information on pixels corresponding to a scanning region of the primary charged particle beam. The information processing unit includes an image processor 102 for executing image processing by use of an image signal as received, and working out an amount of aberration contained in the optical system on the basis of result of the image processing, an output unit 103 for showing image signal and aberration, as received, on a display, and a column controller 104 for determining a column control amount on the basis of the aberration amount computed by the image processor, and so forth.

In the column 100, an electron outgoing from a column electron source 1 passes through a first condenser lens 2, and a deflection coil 3, thereby falling on an aberration corrector 4.

Now, there are described hereinafter actions of multipoles making up the aberration corrector 4, and a track of an electron beam passing through the multipoles. The aberration corrector 4 is made up of 4-stage multipole lenses disposed along an optical axis, respectively, and an electrostatic 4-pole field and an electrostatic 8-pole field are superimposed on the multipole lenses in the first and fourth stages, respectively. Further, an electrostatic 4-pole field and a magnetic 4-pole field are superimposed on the multipole lenses in the second and third stages, respectively. The track of the electron beam passing over the optical axis can be independently changed into an x-direction, and a y-direction, respectively, by adjustment of an electric field, and a magnetic field, in the respective stages. Taking advantage of this, an operation is carried out such that an incident electron beam is split into its components in an x-track, and a y-track, respectively, by the agency of an electrostatic multipole field in the first stage, the incident electron beam is caused to pass through an electromagnetic field superimposed 4-pole field, in the second stage and the third stage, thereby independently cancelling out aberration in the x-track, and the y-track (properly speaking, there is given reverse aberration against aberration caused by the constituent elements of an electron optics column 100, such as an objective lens 7, and so forth), and the tracks as split are caused to revert to the original track in the fourth stage. In so doing, aberration can be corrected during passage of the electron beam through the aberration corrector. As for spherical aberration as well, the aberration is corrected by use of the 8-pole field in the fourth stage.

The SEM according to the present embodiment is provided with a mechanism capable of tilting abeam incident on an object point of an objective lens against the optical axis of the objective lens. With the SEM according to the present embodiment, for example, a two-stage deflector 3 is provided above the aberration corrector, thereby rendering it possible to generate a beam whose center axis has a tilt angle and an azimuth angle, against the optical axis of the objective lens. Information on both the tilt angle, and the azimuth angle of the beam is stored in a memory 13, and is referred to at the time when aberration coefficient is worked out, image data is acquired, and so forth.

The electron beam having passed through the aberration corrector 4 passes through a second condenser lens 5 to be condensed. The electron beam having passed through the second condenser lens 5 is subjected to scanning by a scanning coil 6 to irradiate the specimen 9 placed on the specimen table 8 by the agency of the objective lens 7. The secondary charged particle such as the secondary electron, the reflection electron, and so forth, released from the specimen 9, is detected as the secondary charged particle signal by a detector 10 to be outputted as a luminance distribution type image data from the electron optics column 100 to the image processor 102 via an amplifier 11, and an A/D convertor 12 before being finally stored in the memory 13.

With the image processor 102, an image differentiation part 14 executes differentiation processing of the image data as received, thereby calculating image sharpness, the results of which are stored in a memory 15. An aberration determination part 16 calculates aberration coefficients of respective aberrations remaining in the optical system on the basis of the image sharpness stored in the memory 15. Calculation results are outputted to the column controller 104. In the column controller 104, an estimating part 17 for estimating amount of control signal of the device calculates a correction signal at the time of the next measurement by differential calculation with an value of current, or voltage, presently being applied to the multipole lenses of the aberration corrector 4, on the basis of the aberration coefficients as calculated. Further, in the estimating part 17 for amount of control signal of the device, a beam tilt angle, and a focus current variation width of an objective lens, as parameters necessary for the next measurement, are found from a spherical aberration value, and on the basis of those values, a control current value of the deflection coil 3, and a focus control current value of the objective lens 7 are also calculated. The results of those calculations are outputted to an aberration correction power control part 18, a tilt angle control part 19, and an objective excitation control part 20, respectively, to be fed back to the aberration corrector 4 of the column, the deflection coil 3, and the objective lens 7 via D/A converters 21, 22, 23, respectively.

Figure 2:
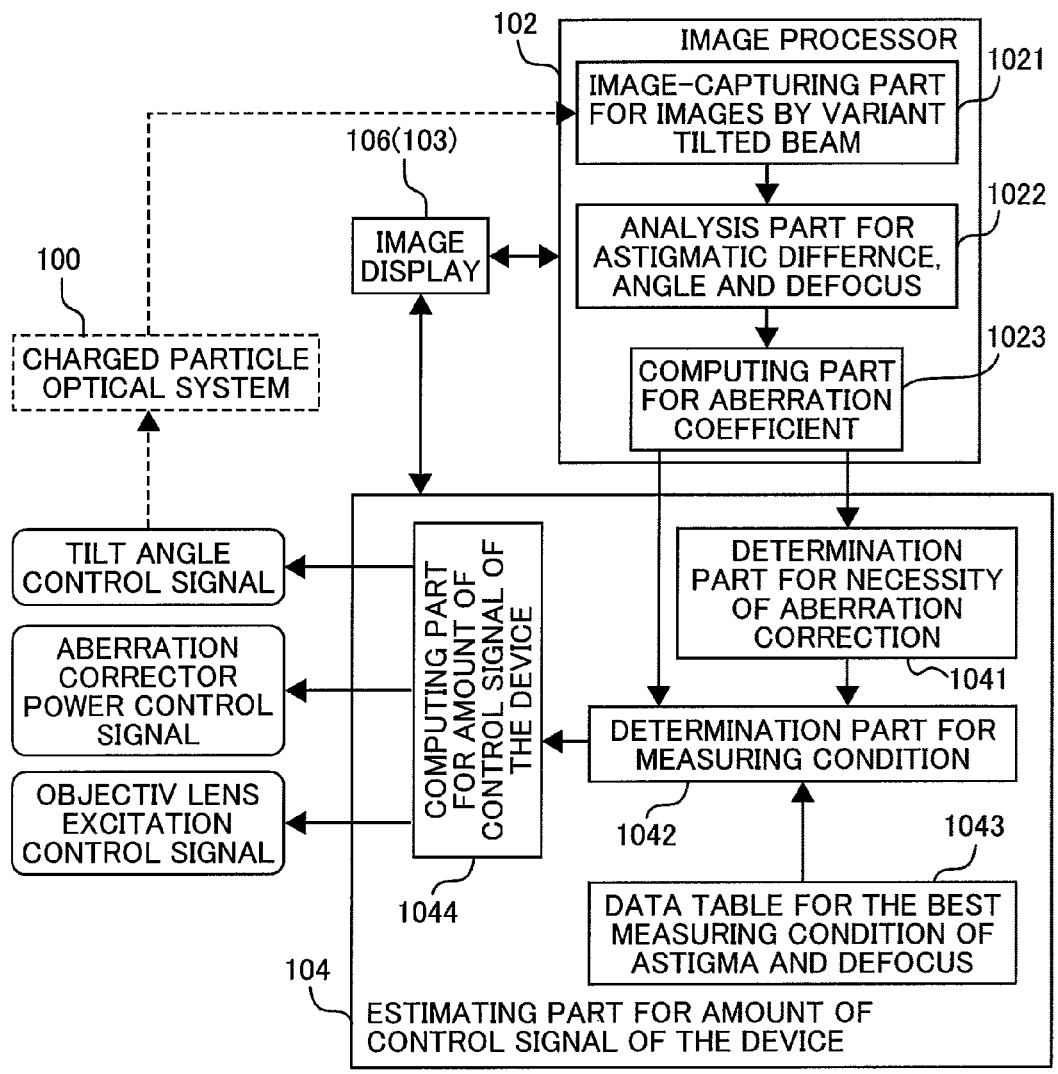
FIG. 2 is a functional block diagram showing processing functions realized in an information processing unit in FIG. 1.

FIG. 2 is a functional block diagram showing processing functions realized in the information processing unit in the case of operations for computation of aberration coefficient, and aberration correction, being executed by the image processor 102, and the column controller 104, shown in FIG. 1, respectively. The image processor 102 includes an image-capturing part 1021 for capturing plural images by causing a beam to scan over a specimen, an incident tilt of the beam against the specimen, and an azimuth angle of the beam being varied, an analysis part 1022 for measuring an astigmatic difference, angle, and defocus with respect to the plural images captured, and a computing part 1023 for computing aberration coefficient from an astigmatic difference, an astigmatic angle, and an amount of defocus, obtained by measurement. Indicated at 106 is a display, and the display is for use in displaying the image signal, and the aberration, received by the image processor 102, and the column controller 104, respectively, the image display also being used in the case of a user inputting an initial-value and setting conditions to the column controller 104.

Further, the column controller 104 includes an aberration correction determination part 1041 for determining necessity of continuing aberration correction on the basis of a relationship between the aberration correction coefficient obtained by the image processor 102, and a target value, a determination part for measuring condition 1042 to determine such measuring condition as to render values of respective aberration coefficients smaller in the case of executing aberration correction, a data table 1043 for giving information to determine the best aberration-measuring condition including measurement of astigma, and defocus, and a computing part 1044 for computing an amount of control signal of the device to generate a signal on the basis of an output from the determination part for measuring condition 1042. The computing part 1044 for computing an amount of control signal of the device calculates output voltage and current values of a control power source (that is, a voltage and excitation current, applied to the multipole lenses of the aberration corrector). Further, the computing part 1044 also generates control signals for a focus current variation width, and a tilt angle, respectively, at the time of focus variation. The charged particle optical system of the electron optics column 100, including the aberration corrector, is under control by feedback of these control signals. The image processor 102, and the column controller 104 each feedback an aberration amount as evaluated for control of not only the aberration corrector but also the deflector, and the objective lens for the purpose of executing the next measurement until higher-order aberration correction as a target is obtained, thereby repeating a re-measuring operation plural times. Such an operation as described is repeated, thereby cancelling out various types of aberrations including spherical aberration and chromatic aberration, occurring to an objective lens, a deflection lens, and so forth as to the charged particle optical system.

The respective operations of the image processor 102, and the column controller 104 can be implemented by the processor running software expanded over the space of the memory in the information processing unit. The software expanded over the memory is normally stored in an external memory of the information processing unit.

Figure 3:
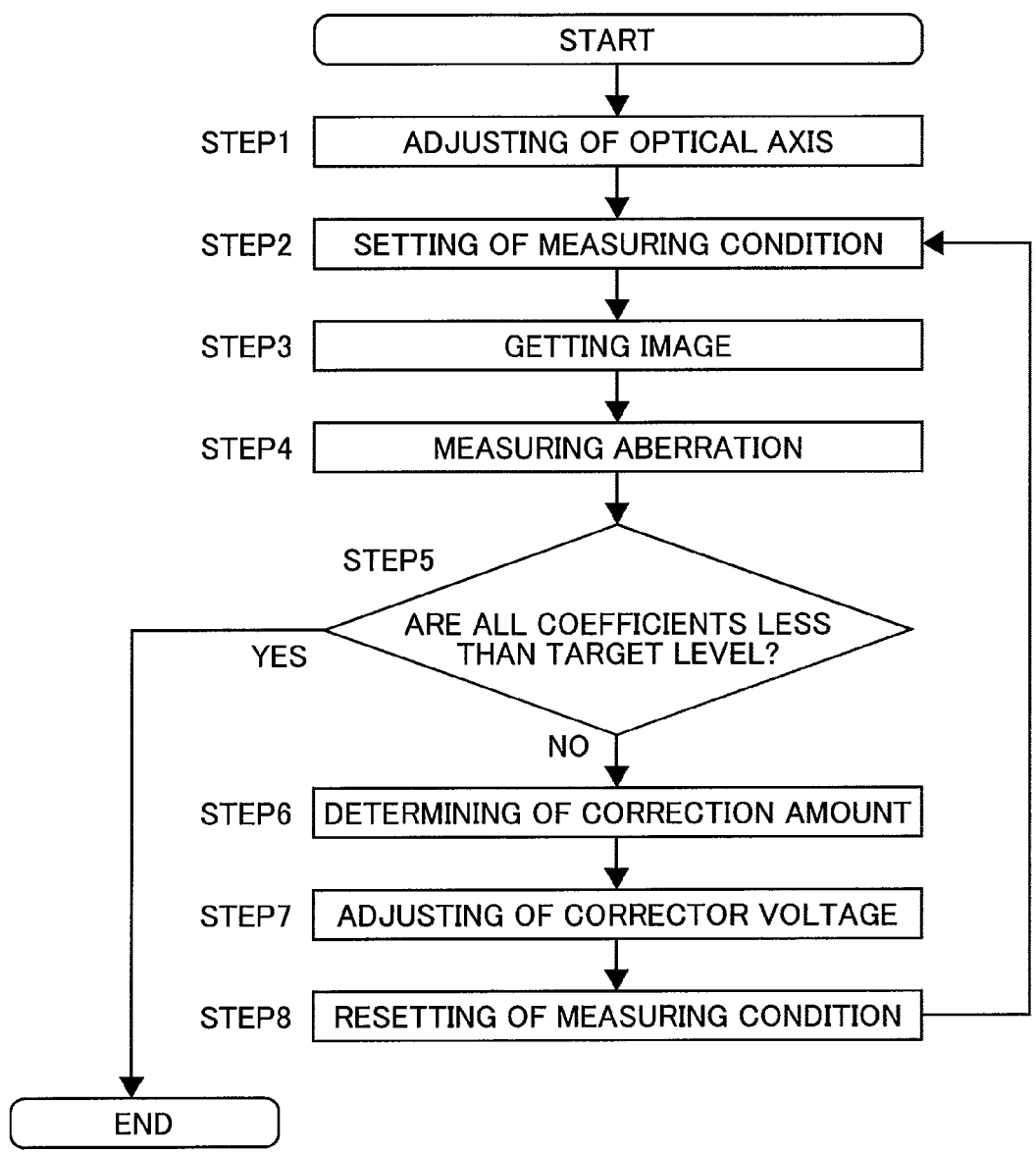
FIG. 3 is a flow chart showing whole processing according to the first embodiment of the invention.
Figure 4:
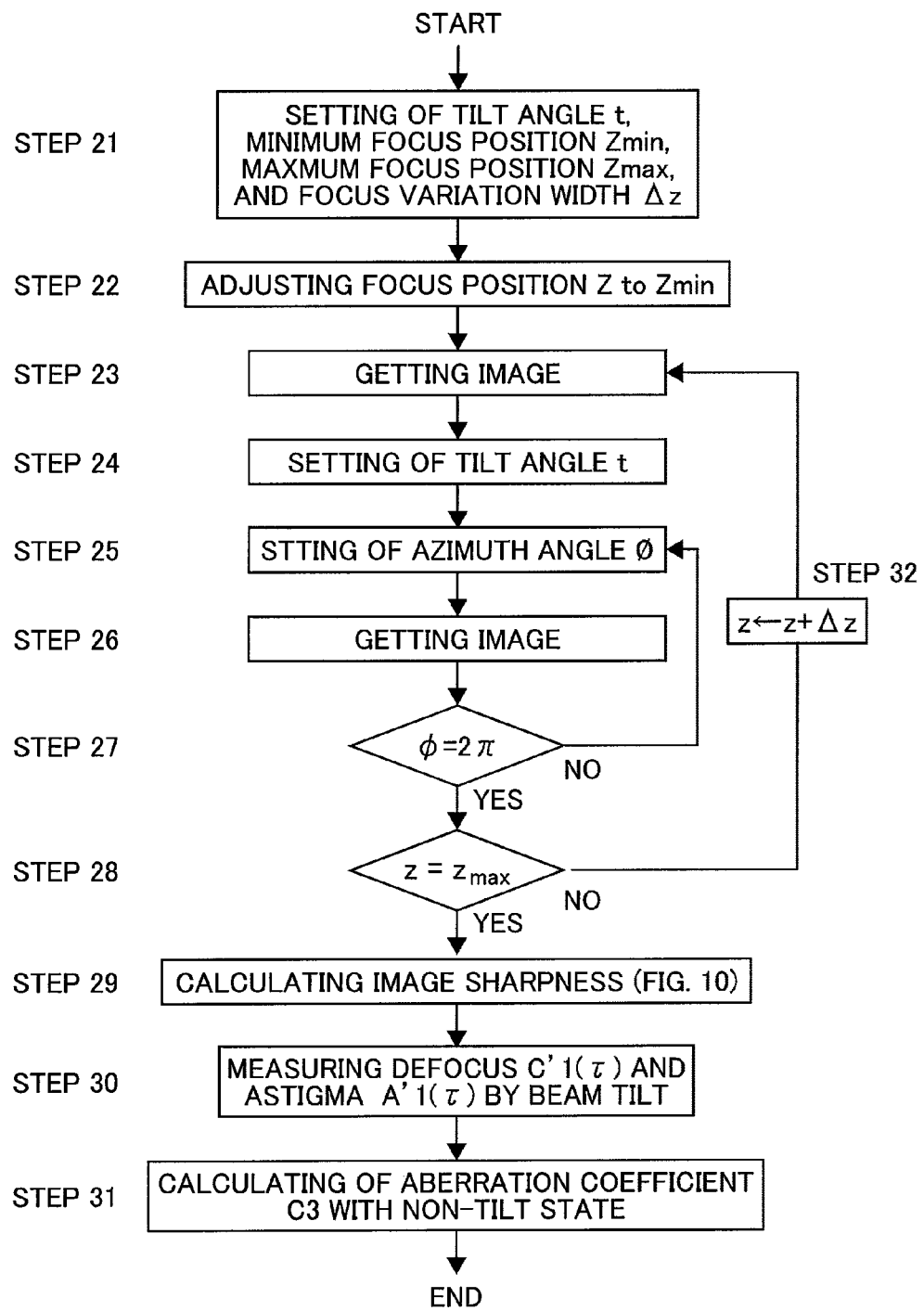
FIG. 4 is a detailed flow chart showing steps from image acquisition up to aberration measurement, shown in FIG. 3.

Next, there is described a procedure for executing aberration correction in the SEM according to the present embodiment with reference to FIGS. 3, and 4.

In FIG. 3, there is shown a flow chart of processing from the start of aberration correction executed by the image processor 102, and the column controller 104, respectively, up to the completion of the aberration correction. First, the stage is moved in pre-preparation, and the specimen 9 for use in focusing, and astigmatic adjustment is scanned to thereby execute normal adjustment of optical axes (step 1), thereby setting conditions for a tilt angle and a focus current variation width, respectively, at the time of the initial measuring. The measuring conditions at this point in time are set to the device via the column controller 104 by determining values from simulation results, and so forth (step 2). In this state, the device gets an image (step 3), and aberration measurement is carried out (step 4), thereby determining whether or not a measured value has reached a target value (step 5). At this point in time, if aberration coefficient is determined less than the target value, the operation for aberration correction comes to the end.

On the other hand, if all the coefficients are found still more than the target values, the operation proceeds to a step of the operation for aberration correction by the aberration corrector 4. In the aberration correction, in order to generate such reverse aberration as to offset aberration on the basis of the coefficient obtained, determination is made on respective values of voltage, and current to be applied to the aberration corrector 4 (step 6), and an adjustment voltage as determined is applied to the corrector (step 7). Subsequently, aberration measurement is executed again in order to examine the effect of correction by the aberration corrector, however, since it is expected that a state of aberration after correction has undergone a change, the user or the device reset a measuring condition according to an expected state of the aberration (step 8), thereby reverting to the step 2 where the tilt angle and the focus current variation width are adjusted.

The processing from adjustment of the device up to the aberration measurement, described as above, represents one series of steps for the aberration correction, and the aberration correction, and the aberration measurement, executed in the steps 2 to 8, are repeated until the coefficient is found less than the target value.

Figure 5:
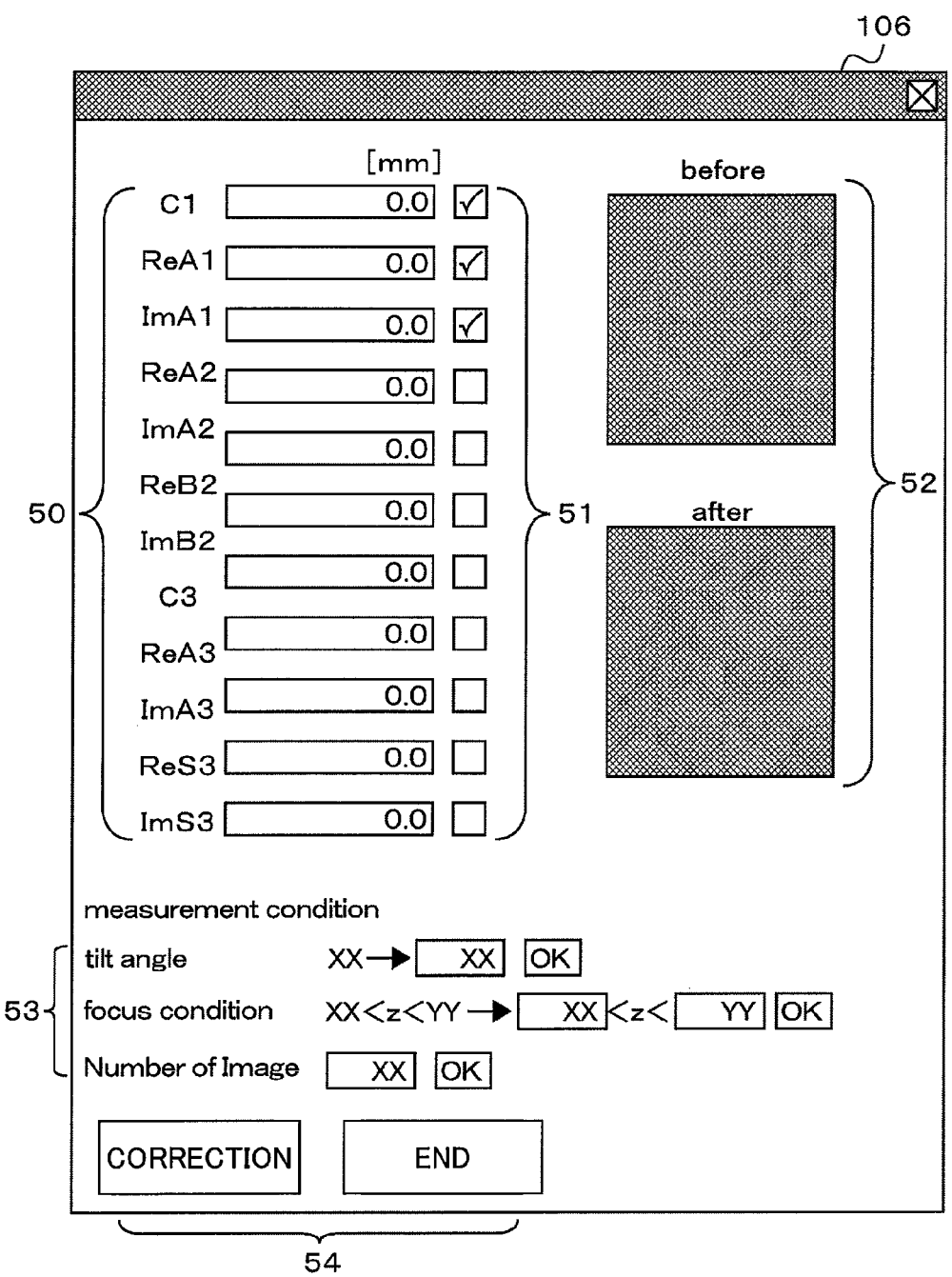
FIG. 5 is a view showing a manipulation screen of a GUI according to the first embodiment of the invention.

The user executes an operation by making use of a GUI shown in FIG. 5, appearing over a screen of the display 106 of the PC, thereby operating the charged particle radiation device. More specifically, the user checks the state of aberration correction via the GUI screen of the display 106, thereby executing setting of a measuring condition, and a correction condition, and checking of results, as necessary. Aberration coefficient as worked out is displayed in a result-displaying part 50, and the user can specify a type of aberration to be corrected in a correction-specifying part 51. A process for the start, or completion of aberration correction can be decided on in a correction-process selection part 54. The user can check a measuring condition from a measuring condition displaying specifying part 53, setting a measuring condition as necessary. Further, a specimen image before aberration correction, and a specimen image after the aberration correction are displayed in an image display 52, and the effect correction can be checked.

Next, referring to a flow chart shown in FIG. 4, there is described in greater detail the processing from the step for setting the measuring condition to the device (the step 2), and getting an image (the step 3), up to the step for measuring aberration (the step 4), as shown in the flow chart of FIG. 3.

In FIG. 4, in a step of processing, corresponding to the step of setting the measuring condition (the step 2) in the flow chart of FIG. 3, a deflection coil current value corresponding to a measured tilt angle t as a parameter necessary for measurement by a tilted beam is first inputted to the tilt angle controller 19, and minimum focus position $z_{min}$ in focus variation, maximum focus position $z_{max}$ in focus variation, and a focus variation width $\Delta z$ are stored in the objective excitation controller 20 (step 21).

Nest, there is described in greater detail the processing for getting an image (the step 3), shown in FIG. 3. In FIG. 4, an initial focus position z is first set to $z_{min}$ (step 22), and an image is acquired to be stored in a memory 13 (step 23). Subsequently, a current value stored in the tilt angle controller 19 is set to the deflection coil 3, and a beam is tilted (step 24). Subsequently, a current value of the deflection coil 3 is adjusted, thereby adjusting a tilt azimuth angle (step 25).

Then, the tilted beam is used for scanning over the specimen to get an image, and the image is stored in the memory 13 (step 26). In the steps 25, 26, 27, respectively, an initial phase is repeatedly varied in a range of $0 \leq \phi < 2\pi$ (step 27). If this is executed until $\phi = 2\pi$, the focus position is varied by $\Delta z$ (step 32) while the operation from the step 23 onwards is repeated until $z = z_{max}$ (step 28).

Response of a magnetic field objective lens to an excitation current takes time owing to magnetic after effect. Accordingly, if a focus excitation value of the objective lens 7 is kept in as-fixed state as described above, and an image is acquired by varying the current value of the deflection coil 3 on an identical focal plane, this will minimize the number of counts of focus excitation variations of the objective lens, thereby enabling time loss owing to the magnetic after effect to be minimized. As a result, with this method, it is possible to get an image at a higher speed as compared with a method whereby a focal plane is continuously varied with a current value of the deflection coil 3, kept in as-fixed state.

This is further described with reference to FIG. 6. FIG. 6 is a view depicting an example of an image shooting order, representing the case of shooting 30 pieces of images, in total, including images that are shot at five different focus positions, respectively, each image being oriented in six different azimuth angular directions. In this case, there are conceivable two different shooting orders, including a method of shooting in the order of (1)-A, (1)-B, . . . (1)-F, (2)-A, . . . , (5)-F, as shown FIG. 6 (*a*), and another method of shooting in the order of (1)-A, (2)-A, . . . (5)-A, (1)-B, . . . , (5)-F, as shown FIG. 6 (*b*).

With the method shown in FIG. 6 (*b*), the focus position has to be changed 30 times in total, including setting to an initial position, however, the method shown in FIG. 6 (*a*), it need only be sufficient to change the focus position 5 times. Accordingly, it is apparent that the method shown in FIG. 6 (*a*) has an advantage over the method shown in FIG. 6 (*b*) in terms of optimization of focus position variation. Since a response speed of the deflection coil is generally higher than a response speed of objective lens, adoption of the method shown in FIG. 6 (*a*) is advantageous in terms of image shooting time. Further, as shown in FIG. 6 (*c*), image shooting may be executed in the order of (1)-A, (1)-B, . . . (1)-F, (2)-F, . . . , (1)-A, in staggered azimuth angular directions, respectively. In this case, the number of counts of azimuth angle variations can be reduced by one count for every variation in the focus position.

Upon completion of image shooting, a processing step corresponding to the aberration measurement shown in FIG. 3 (the step 4) is then executed. More specifically, in FIG. 4, the image differentiation part 14 of the image processor 102 evaluates image sharpness (step 29), the results of which are stored in the memory 15. Data on the image sharpness, stored in the memory 15, is outputted to the aberration determination part 16, the aberration determination part 16 calculates defocus $C_1'$, and astigma $A_1'$, at the time of the beam tilting, using the data on the image sharpness (step 30), on the basis of which aberration coefficient $C_3$ is calculated (step 31). The aberration coefficient $C_3$ as calculated is sent out to the estimating part 17 for amount of control signal of the device.

In a processing step for evaluation on the image sharpness (step 29), the sum of square of a directional differentiation value in each of 4 directions of 0°, 45°, 90°, and 135° is found by use of a Sobel filter as shown in FIG. 7 to be defined as an evaluation value by the direction. The Sobel filter is used in order to find astigma.

Figure 8:
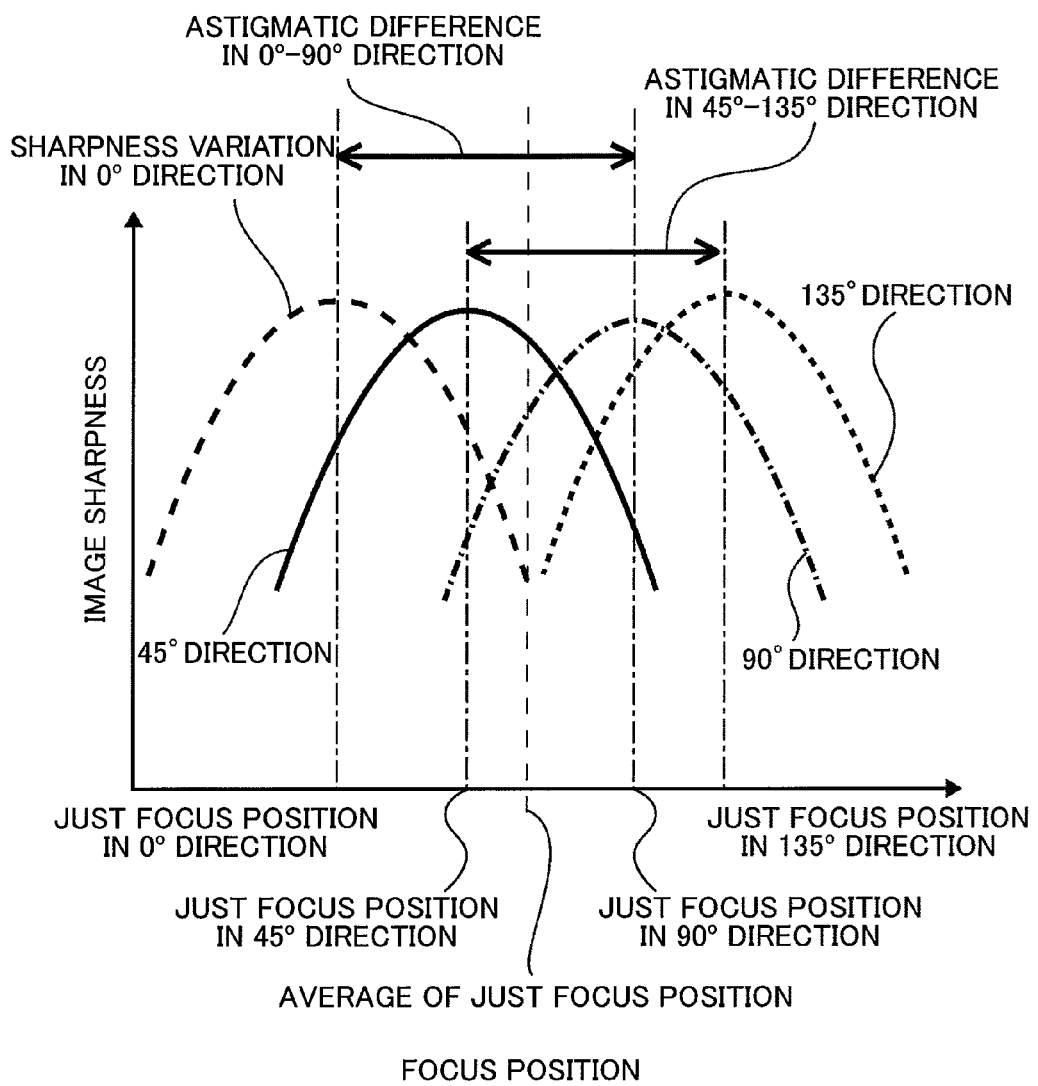
FIG. 8 is a view showing distribution of directional sharpness of an image containing astigma.

In the case of an image containing astigma, since a just focus position varies according to a direction, as shown in FIG. 8, the peak position of image sharpness by the direction varies according to magnitude of the astigma. Accordingly, the magnitude of the astigma (astigmatic difference) can be estimated from magnitude of shift in the peak position. Then, an average of the respective peaks in the 4 directions of 0°, 45°, 90°, and 135° corresponds to the middle of focus positions in the image containing the astigma. Magnitude of defocus of the image can be estimated from a difference between the focus position at this point in time, and the focus position before the beam tilting.

Next, there is described the principle behind calculation of the aberration coefficient $C_3$ executed by the aberration determination part 16 (step 31). When an object point is irradiated with an electron beam in as-tilted state at a given tilt angle, an optical path difference occurs to the electron beam due to tilting of the beam, and aberration is added to an image of a specimen, due to the tilting of the beam.

Assuming that function expressing an optical path difference is generally defined as $\chi(\omega)$, $\chi(\omega)$ can be analytically represented by use of aberration coefficient of a plurality of orders. Herein, if $\chi(\omega)$ is written with reference to aberration coefficient of up to 3-orders, it can be expressed by equation (1) as follows.

[Equation 1]

$$x(\omega) = \text{Re}\left(\frac{1}{2}\omega\bar{\omega}C_1 + \frac{1}{2}\bar{\omega}^2 A_1 + \omega^2\bar{\omega}B_2 + \frac{1}{3}\bar{\omega}^3 A_2 + \frac{1}{4}\omega^2\bar{\omega}^2 C_3 + \omega^3\bar{\omega}S_3 + \frac{1}{4}\bar{\omega}^4 A_3 + \ldots\right) \quad (1)$$

In the equation (1), reference characters $A_O$, $C_1$, $A_1$, $B_2$, $A_2$, $C_3$, $S_3$, and $A_3$ denote an image shift, defocus, 2-time symmetrical astigma, axial coma aberration, 3-time symmetrical astigma, 3-order spherical aberration, star aberration, and 4-time symmetrical astigma, respectively. Further, a reference character $\omega$ represents complex coordinates on an object plane. In this case, if an incident electron beam is tilted by a tilt angle $\tau$, $\chi(\omega)$ can be expressed by equation (2) as follows. The tilt angle $\tau$ is expressed by a complex number.

[Equation 2]

$$x(\omega + \tau) = \text{Re}\left(\frac{1}{2}\omega\bar{\omega}C_1(\tau) + \frac{1}{2}\bar{\omega}^2 A_1(\tau) + \omega^2\bar{\omega}B_2(\tau) + \frac{1}{3}\bar{\omega}^3 A_2(\tau) + \frac{1}{4}\omega^2\bar{\omega}^2 C_3(\tau) + \omega^3\bar{\omega}S_3(\tau) + \frac{1}{4}\bar{\omega}^4 A_3(\tau) + \ldots\right) \quad (2)$$

In the equation (2), reference characters $C_1(\tau)$, $A_1(\tau)$ ... denote respective aberration coefficients at the time when the electron beam is tilted. The respective aberration coefficients at the time of the beam tilting are expressed by the sum of the tilt angle $\tau$ of electron beam, and aberration coefficient at the time when the beam is not tilted. In the case where, for example, up to 3-order aberration coefficient is taken into consideration, defocus $\{C_1(\tau)\}$ appearing by beam tilting is expressed by equation (3) as follows.

[Equation 3]

$$C_1(\tau) Re[C_1 + 2C_3 \tau\bar{\tau} + 4B_2 \tau + 6S_3 \bar{\tau}] \quad (3)$$

Similarly, 2-time symmetrical astigma $A_1(\tau)$ appearing due to tilting is expressed by equation (4) as follows.

[Equation 4]

$$A_1(\tau) = A_1 + 2A_2\bar{\tau} + 2\bar{B}_2\tau + C_3\tau^2 + 6\bar{S}_3\tau\bar{\tau} + 3A_3\bar{\tau}^2 \quad (4)$$

As is evident from the equation (3), and the equation (4), all the aberration coefficients up to 3-orders before beam tilting are contained in $C_1(\tau)$, and $A_1(\tau)$, respectively. In this case, if higher-order aberration coefficient is contained in the equation (1), $\chi(\omega)$ can be expanded as an optional-order polynomial. Further, even if $\chi(\omega)$ is expressed as the optional-order polynomial, $C_1(\tau)$, and $A_1(\tau)$ each are still expressed in a form containing optional-order aberration coefficients before beam tilting. That is, when respective function systems of $C_1(\tau)$, and $A_1(\tau)$, and the coefficients thereof are known, all the optional-order aberration coefficients can be found.

Next, if an irradiation direction of an incident beam is complex-displayed, $\tau$ can be expressed by equation (5) as follows on the basis of a tilt angle t against the optical axis of a lens, and an azimuth angle $\phi$ on a lens plane.

[Equation 5]

$$\tau = te^{i\phi} \quad (5)$$

If the equation (5) is substituted for the equation (3) and the equation (4), respectively, to be rearranged, the equation (3) and the equation (4) can be written in the form of equation (6).

[Equation 6]

$$\sum_{k=0}^{n} m_k(t) e^{ik\phi} \quad (6)$$

Herein, mk(t) is a coefficient expressed by a formula established through linear bonding between respective aberrations before beam tilting and t.

If $C_1(\tau)$, and $A_1(\tau)$, for each of several azimuth angles $\phi$ at a tilt angle t, are measured, and fitting by the least squares method is applied thereto, it is possible to find a fitting curve providing a relationship between $C_1(\tau)$ and the azimuth angles $\phi$ from the equation (6) can be found. If the equation (6) is substituted for the equation (3), equation (7) is established as follows.

[Equation 7]

$$C_1(t,\phi) = Re[(C_1 + 2C_3 t^2) + 4B_2 t e^{i\phi} + 6S_3 t^2 e^{2i\phi}] \quad (7)$$

If Euler's formula is applied to the equation (7), the equation (3) will eventually become equation (8) as follows.

[Equation 8]

$$C_1(t, \phi) = (C_1 + 2C_3 t^2) + 4\text{Re}B_2 t\cos\phi - 4\text{Im}B_2 t\sin\phi + 6\text{Re}S_3 t^2 \cos 2\phi + 6\text{Im}S_3 t^2 \sin 2\phi \quad (8)$$

Accordingly, when a value of $C_1(t,\phi)$ is measured by varying $\phi$ against a constant value t, and the fitting by the least squares is applied to $\phi$ of the equation (7) by using the value as obtained, respective values of $(C_1+2C_3 t^2)$, $\text{Re}B_2$, $\text{Im}B_2$, $\text{Re}S_3$, and $\text{Im}S_3$ can be found from coefficients in respective terms. Further, if a value of $C_1$ at the time of the beam in non-tilt state is measured beforehand, a value of $C_3$ can be found from the respective values of $(C_1+2C_3 t^2)$. As described in the foregoing, coefficient before the beam tilting can be found from a measured value of $C_1$ (t, φ) at the time of the beam tilting.

As for $A_1(t, φ)$, similar calculation can be performed. Since $A_1(t, φ)$ contains respective terms related to $A_2, A_3$, not shown in the equation of $C_1$ (t, φ), $A_2, A_3$ can be found only if $A_1(t, φ)$ is examined. Thus, all the aberration coefficients before the beam tilting can be calculated by measuring the respective values of $A_1(t, φ)$, and $C_1$ (t, φ) as described in the foregoing.

The estimating part 17 for amount of control signal of the device compares a measured value of aberration coefficient with a target value on the basis of the aberration coefficient as sent out, thereby determining whether or not aberration correction is continued (refer to the step 5 in FIG. 3). If the value of the aberration coefficient is greater than the target value, aberration correction is continued, thereby working out a measuring condition necessary for the next aberration measurement on the basis of aberration coefficient as obtained, aberration corrector 4 (refer to the step 6 in FIG. 3). An example of a method for working out a measuring condition is described in detail hereinafter. In aberration measurement, there is the need for measuring astigma, and defocus at the time of the beam tilting, and those values represent functions of aberration, a beam tilt angle, and an azimuth angle, contained in a beam when a beam is not tilted. Accordingly, the measuring condition in the step 6 can be decided on from the aberration coefficient obtained in the step 4 of FIG. 3. If, for example, spherical aberration coefficient is designated as $C_3$, magnitude of defocus $C_1'$, and magnitude $A_1'$ of astigma, occurring owing to spherical aberration at the time of the beam tilting, can be expressed by equation (9), and equation (10), respectively, as follows.

[Equation 9]

$$C_1' = 2C_3 t^2 \quad (9)$$

[Equation 10]

$$A_1' = 2C_3 t^2 e^{2i\phi} \quad (10)$$

In the equation (9), and the equation (10), respectively, t denotes a tilt angle, and φ denotes an azimuth angle. The equation (9), and the equation (10) each represent a linear function of $C_3$ where a tilt angle t, and an azimuth angle φ are constants, and $C_3$ is a variable.

Figure 9:
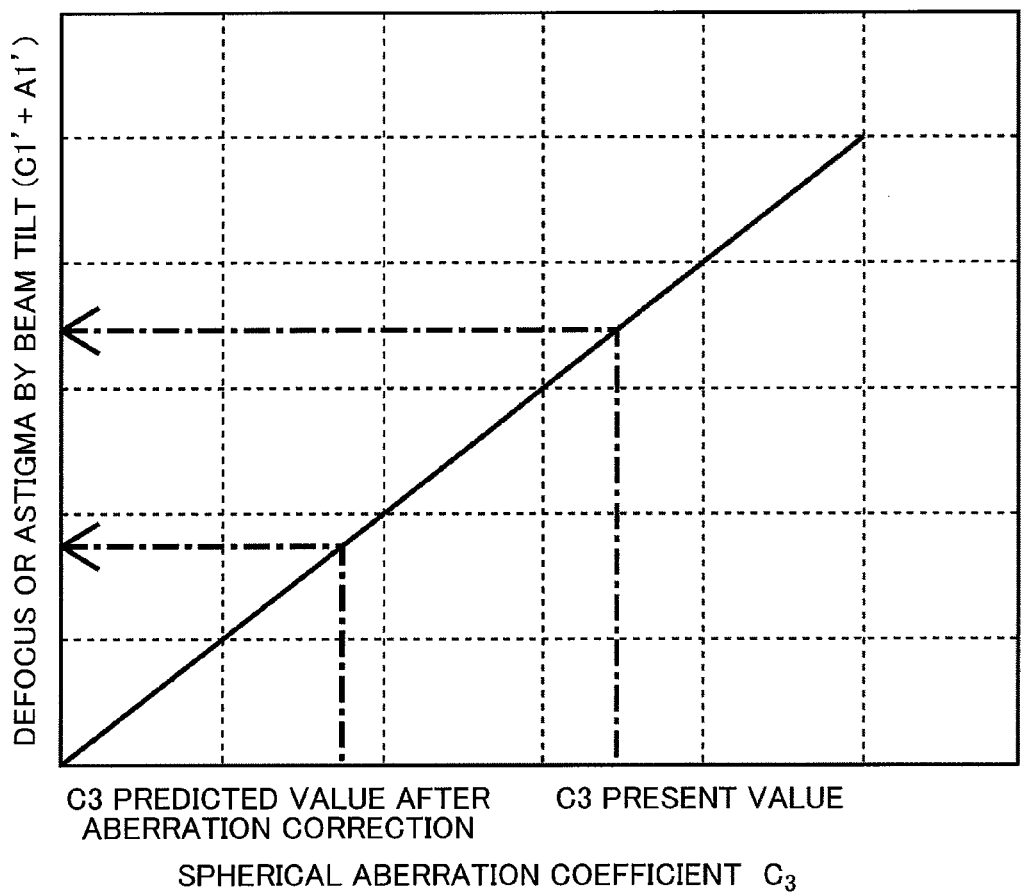
FIG. 9 is a view showing a relationship among spherical aberration with defocus and astigma at the time of beam tilting.

More specifically, as shown in FIG. 9, $C_3$ is in linear functional relationship with $C_1'$ and $A_1'$ where the tilt angle t is a constant. Accordingly, assuming that the tilt angle t is fixed, if magnitude of present spherical aberration $C_{3-1}$, a predicted value $C_{3-2}$ of spherical aberration as a target (at the time of the next aberration evaluation), and the tilt angle t are known, it is shown that respective values of $C_1'$ and $A_1'$ can be estimated by calculation. More specifically, $C_1'$ and $A_1'$ are measured at a tilt angle t to find a value of $C_{3-1}$ by computation, thereby predicting magnitude of $C_{3-2}$ as spherical aberration after the next correction on the basis of the value of $C_{3-1}$ as obtained, a voltage applied to the aberration corrector, and so forth. And with a relationship between the respective values of $C_1'$ and $A_1'$, corresponding to a predicted value of $C_{3-2}$, being kept pre-stored as data table information in the device, it is possible to set the next measuring condition optimum for measuring the respective values of $C_1'$ and $A_1'$. In this connection, at the time of an initial measurement, if a value of spherical aberration existing in the optical system is estimated by simulation beforehand, it need only be sufficient to perform setting by referring to the value.

Herein, the measuring condition optimum for measuring the respective values of $C_1'$ and $A_1'$, for the next measurement, is meant by a condition under which the respective values of $C_1'$ and $A_1'$ can be adequately measured. For example, in the case of finding those values from a peak value in image sharpness variation, it is required that a peak point of image sharpness is always contained between the minimum focus position $z_{min}$, and the maximum focus position $z_{max}$ in focus variation, regardless of an azimuth angle, and additionally, there is contained a region where image sharpness on the periphery of the peak undergoes a monotonic decrease so as to enable the peak point to be discriminated. For this reason, it is required that a range of $z_{max}$ to $z_{min}$ is rendered somewhat greater than magnitude of an astigmatic difference.

This is described with reference to FIG. 10. FIG. 10 is an example of a graph showing image sharpness variation in the case where images are obtained while focus is being varied. In the graph, the horizontal axis indicates focus current (objective lens excitation), and the vertical axis indicates image sharpness. Respective points on the graph show a distribution of sharpness found from respective images obtained at the focus currents of the respective points. A point at the highest image sharpness is a just focus position, and an extent to which the peak position is deviated from a reference position is essential information. With an example (a) in FIG. 10, a well-defined peak exists within a focus current variation width along the horizontal axis of the graph, in which case, a just focus position can be adequately found.

On the other hand, with an example (b) in FIG. 10, a well-defined peak does not exist within the focus current variation width, so that the graph ends up in depicting nothing but a monotonic phenomenon. This is an example in which a range for focus variation is erroneously set, and the peak of image sharpness exists on the outside of the left end of the horizontal axis of the graph. In such a case, it is not possible to find a just focus position. Because the peak of image sharpness is moved according to magnitude of aberration, a tilt angle, and an azimuth angle, in order to correctly execute aberration measurement, a value with leeway to some extent has to be set such that a just focus position is in a focus current variation width corresponding to the extent of aberration at that point in time, and can be adequately found against measurement at all azimuth angles. As a general rule of thumb, a value of the focus current variation width, corresponding to the order of 2 to 4 times as large as an astigmatic difference, may be sufficient.

In the case of the example described as above, the respective values of $C_1'$ and $A_1'$, for the next measurement, are predicted on the assumption that the tilt angle t is a constant, however, if there are limitations to a range where $C_1'$ and $A_1'$ can be measured with high precision, the tilt angle t may be adjusted such that the respective values of $C_1'$ and $A_1'$, for the next measurement, can fall within a desired range. It can be considered that $C_1'$ and $A_1'$, in the equation (9), and the equation (10), respectively, are in a quadratic functional relationship with t, so that an optimum value of t can be estimated from a predicted value of $C_3$. This is effective in the case where aberration in the initial stage of aberration correction, in particular, is very large, and very large defocusing occurs only if objective excitation is slightly changed, and on the contrary, in the case where there are limitations to objective excitation that can be applied because of a problem of magnetic after effect when low-order aberration is corrected in the final stage of aberration correction, and aberration by a tilt amount in the past becomes insusceptible to affect an image by a tilted beam.

With the example described as above, the respective values of $C_1{}'$ and $A_1{}'$, for the next measurement, are estimated by referring to the magnitude of spherical aberration as the most representative aberration. However, even in the case where aberrations other than spherical aberration becomes dominant after correction, and $C_1$ and $A_1$ have occurred, the respective values $C_1{}'$ and $A_1{}'$ can be estimated on the basis of those aberrations as is the case with the spherical aberration, thereby setting $z_{max}$ and $z_{min}$, corresponding thereto.

Thus, if a value of defocus $C_1{}'$ and a value of astigma $A_1{}'$ (astigmatic difference), occurring owing to aberration at the time of the beam tilting, are known beforehand on the basis of a value of aberration contained in the optical system to thereby set the next measuring condition, this will enable the best aberration measuring condition to be set for aberration, so that an advantageous effect of higher accuracy in measurement is gained, leading to higher speed in aberration correction.

With the present embodiment, it is always possible to measure aberration under the best condition adapted to a state of aberration varying according to a state of aberration correction, thereby enhancing measurement accuracy. As a result, enhancement of accuracy in aberration correction can be expected, and the number of counts of processing up to the end of correction operations can be reduced.

Second Embodiment

There is described hereinafter a measuring SEM according to a second embodiment of the present invention.

Figure 11:
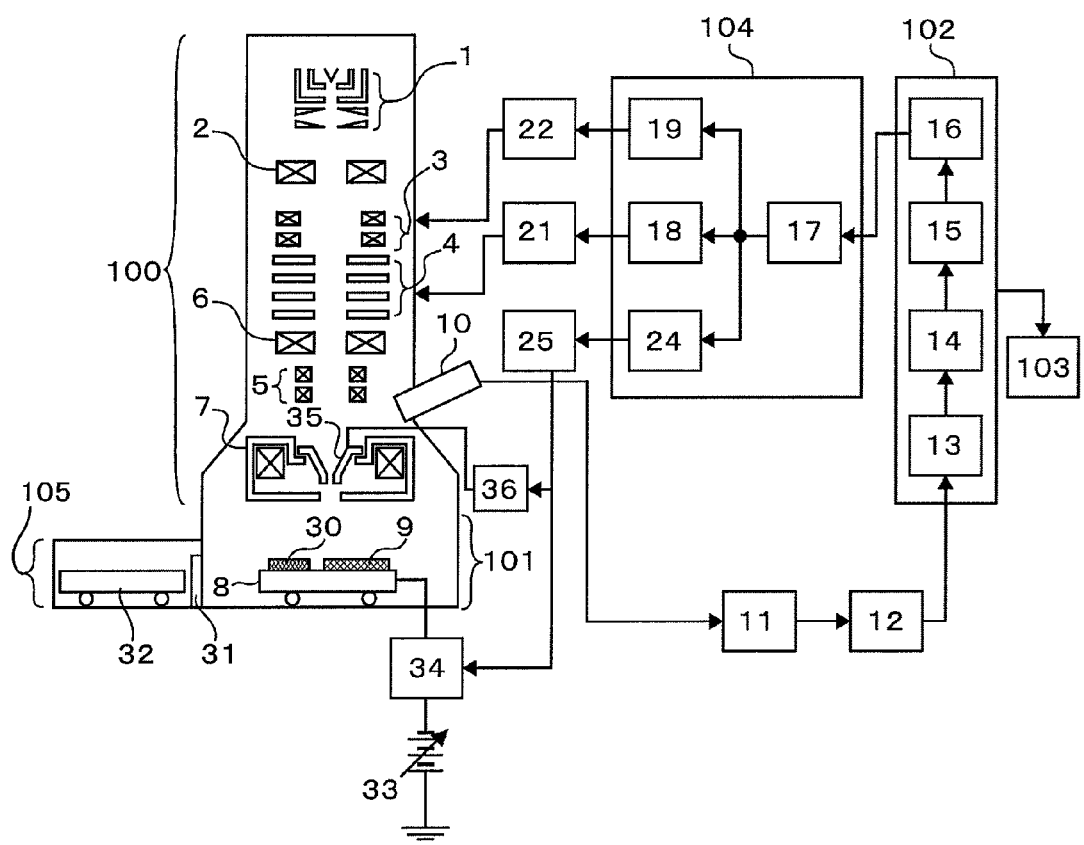
FIG. 11 is a system block diagram of a measuring SEM according to a second embodiment of the present invention.

FIG. 11 shows a system configuration of the measuring SEM according to the present embodiment. The measuring SEM is a device for executing pixel computation to thereby measure a distance between two points on image data as measured. The measuring SEM according to the present embodiment includes:

a specimen preparation chamber 105 for guiding a specimen into a device, a specimen chamber including a specimen table 8 for holding a specimen 9, a column 100 provided with a function for irradiating the specimen 9 with an electron beam, and detecting a secondary electron generated, or a reflection electron, thereby outputting detection results as a signal, an image processor 102 for processing the signal outputted, thereby executing various operations, an electron optics controller 104 for controlling a column on the basis of an output from the image processor 102, an output unit 103 for displaying image data as processed by the image processor 102, and so on.

The electron optics controller 104 is provided with an estimating part 17 for amount of control signal of the device, an aberration correction power control part 18, and a power source control part 24. In the estimating part 17 for amount of control signal of the device, a beam tilt angle, and a focus current variation width of an objective lens, as parameters necessary for the next measurement, are found from a spherical aberration value, and on the basis of those values, a control current value of a deflection coil 3, a retarding voltage, or a boosting voltage is calculated. An output of the power source control part 24 is fed to a retarding power source control part 34, and a boosting power source electrode control part 36 via a D/A converter 25.

Respective constituent elements of the device according to the present embodiment being substantially identical in terms of function and action to those described with reference to the first embodiment, repetition in description will be omitted hereinafter.

The specimen preparation chamber 105 is separated from a specimen chamber 101 of a device main body by means of a gate valve 31. The gate valve 31 is open when the specimen 9 is guided into the device, and the specimen is guided into the specimen chamber of the device main body by a specimen-transport mechanism 32. Further, device adjustment is carried out with the use of the standard specimen 30 placed on a specimen table 8.

With the measuring SEM according to the present embodiment, a boosting electrode 35 is provided above a magnetic field objective lens 6. An electrostatic lens is formed by applying an electric field to the boosting electrode, and fine adjustment of focus can be effected by varying intensity of the electrostatic lens. A voltage applied to the boosting electrode 35 is varied by controlling the boosting power source electrode control part 36 (boosting focus). Further, a voltage (a retarding voltage) for forming a retarding field against an incident electron beam is applied to the specimen table 8 by the agency of a retarding power source 33, however, the adjustment of focus can also be effected by controlling the retarding voltage the agency of the retarding power source control part 34 (retarding focus). Since the response of a magnetic field objective lens to an excitation current normally takes time owing to the magnetic after effect, focus variation can be effected at a high speed by adjusting the boosting voltage, or the retarding voltage instead of an objective lens excitation current.

With the present embodiment, it is possible to carry out image shooting by taking full advantage of the feature thereof, including high-speed responsiveness of the boosting focus, and the retarding focus, and insusceptibility to the effect of magnetic after effect, and by varying a focus position while an azimuth angle is kept fixed as shown FIG. 6 (b). FIG. 6 (b) shows the example of the image shooting order, in which image shooting is performed by taking a point on an optical axis, and six different azimuth angles are taken on a plane perpendicular to the optical axis, and taking five different focus positions, in respective azimuth angular directions. This image shooting method is advantageous in that an effect of time-dependent variation on a tilt condition of one beam can be reduced as compared with a method according to the first embodiment, for varying an azimuth angle with a focus position as-fixed state, thereby executing image shooting, and an effect of specimen drift can be inhibited at the time of measuring defocus, and astigma, due to tilting.

Third Embodiment

Figure 12:
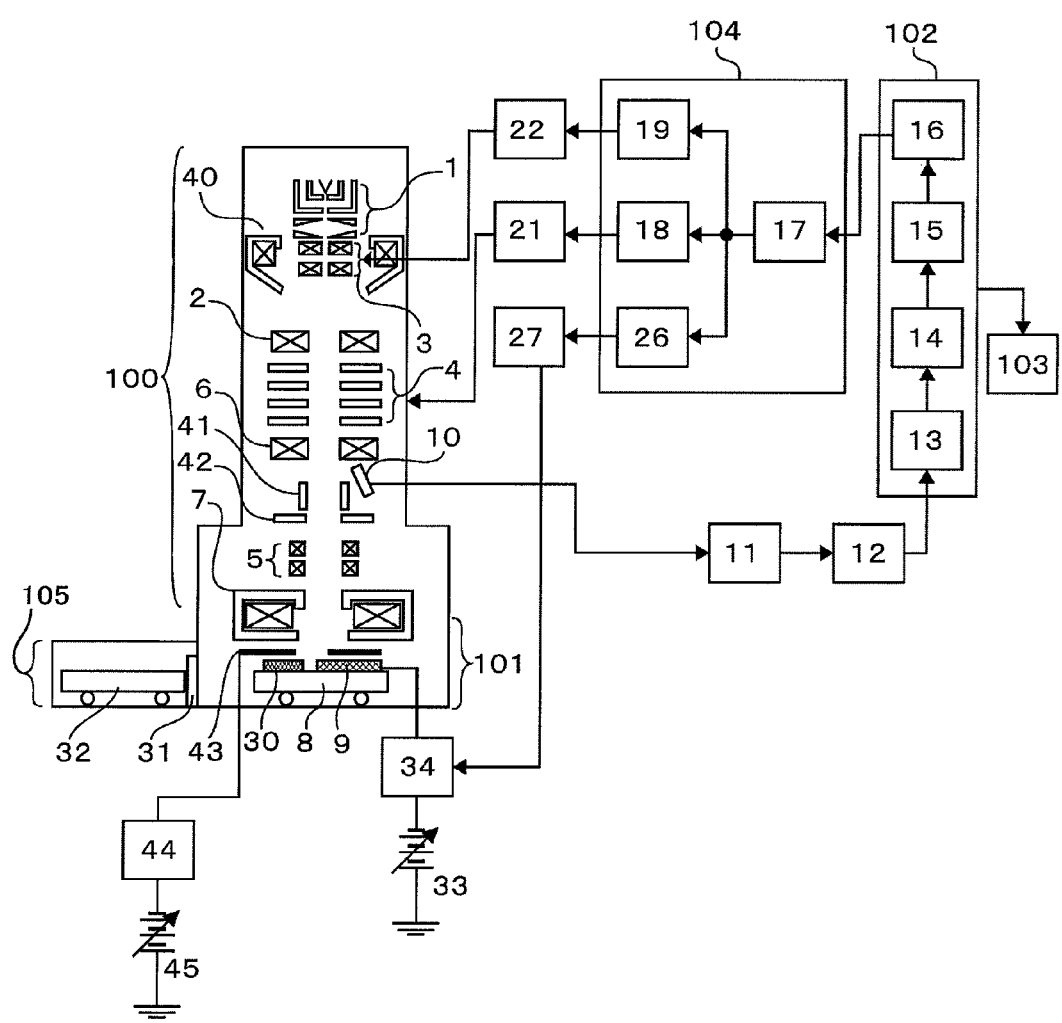
FIG. 12 is a system block diagram of an inspection SEM according to a third embodiment of the present invention.
Figure 13:
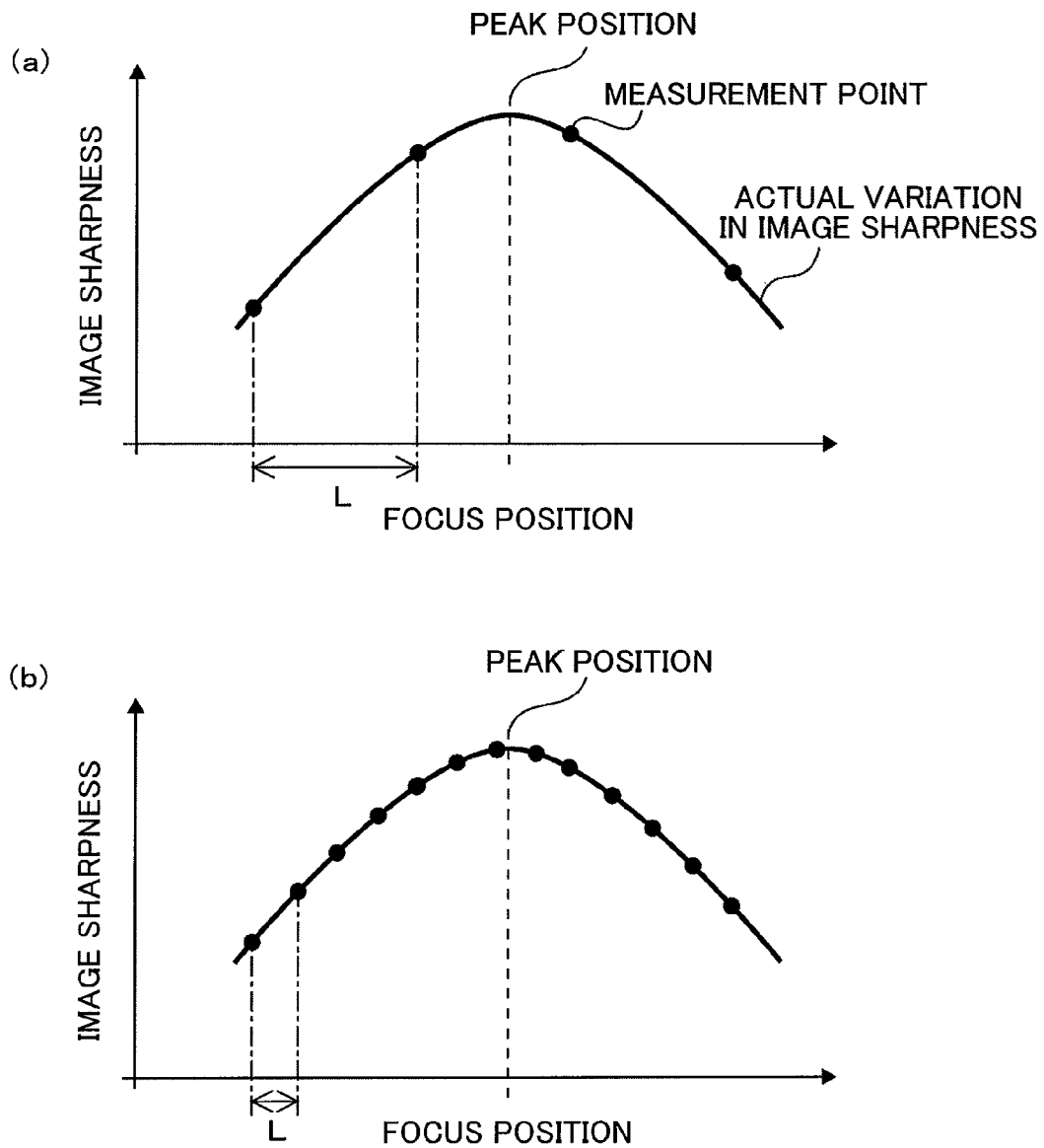
FIG. 13 is a view showing a relationship between a focal interval and measuring resolution.
Figure 14:
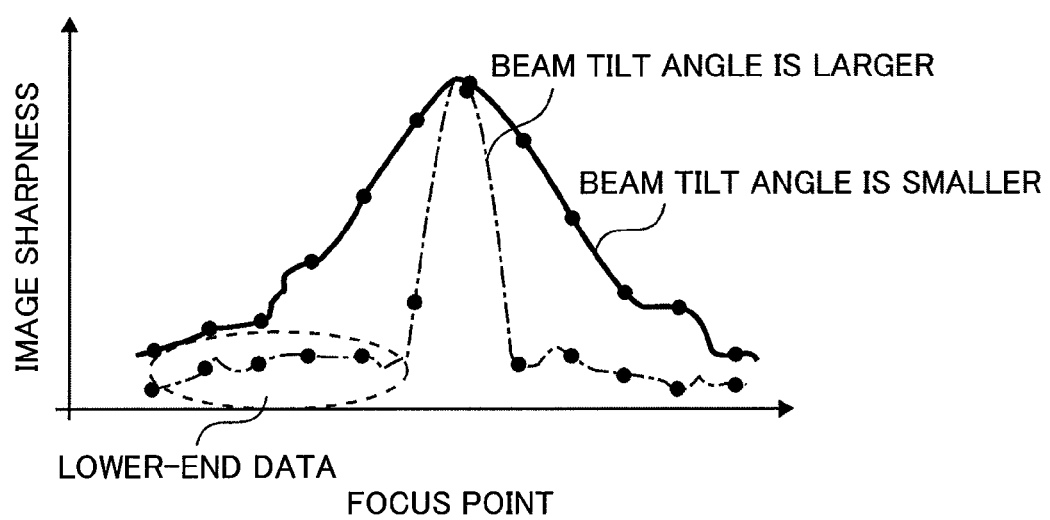
FIG. 14 is a view showing difference in sharpness distribution, caused by a beam tilt angle.

There is described an inspection SEM according to a third embodiment of the invention with reference to FIG. 12. FIG. 12 is a system block diagram of an inspection SEM with a magnetic field superimposed electron gum mounted therein. The inspection SEM is a retarding type scanning electron microscope provided with a means for measuring a surface potential of a specimen, and a charge-control means.

The inspection SEM according to the present embodiment is comprising a specimen preparation chamber 105, a specimen chamber 101, a column 100, a column controller 104 and an image processor output unit 103, and so forth. The column controller 104 is provided with an estimating part 17 for amount of control signal of the device, an aberration correction power control part 18, a tilt angle control part 19, and a power source control part 26. In the estimating part 17 for amount of control signal of the device, a beam tilt angle, and a focus current variation width of an objective lens, as parameters necessary for the next measurement, are found from a spherical aberration value, and on the basis of those values, a control current value of a deflection coil 3, a retarding voltage or a charge-control electrode control-voltage is calculated. An output of the power source control part 26 is fed to a retarding power source control part 34, and a charge-control electrode control part 44 via a D/A converter 27.

The basic principle underlying the present embodiment is the same as that for the SEMs according to the first and second embodiments, respectively. Therefore, there is described hereinafter only a unique aspect of the configuration of the inspection SEM according to the present embodiment With the inspection SEM, it is necessary to get a large current beam, so that a electron beam outgoing from an electron source 1 is converged by a condenser lens 40 disposed in the vicinity of the electron source before irradiating a specimen. In order to enable an aberration corrector 4 to cancel out aberration of an optical system including the condenser lens 40, a deflection coil 3 is disposed above a position of the condenser lens 40 such that the aberration of the optical system including the condenser lens 40 can be measured.

Further, in order to detect a continuity defect of a specimen, the specimen is charged by using of a charge-control electrode 43, and a difference between secondary electron signal amounts, due to an electrostatic potential difference between a normal par and a defective part, is detected by a secondary electron detector 10. The charge-control electrode 43 is controlled by controlling a charge-control power source 45 by the agency of the charge-control electrode control part 44, and secondary electrons as generated arrive at the secondary electron detector 10 via a convergent lens 42 for the secondary electrons, and an E×B deflector 41.

With the present embodiment, it is always possible to measure aberration under the best condition adapted to a state of aberration varying according to a state of aberration correction, thereby enhancing measurement accuracy. As a result, enhancement of accuracy in aberration correction can be expected, and the number of counts of processing up to the end of correction operations can be reduced.

EXPLANATIONS OF REFERENCE SIGNS

1 . . . an electron source, 2 . . . a first condenser lens,
3 . . . a deflection coil, 4 . . . an aberration corrector,
5 . . . a second condenser lens, 6 . . . a scanning coil,
7 . . . an objective lens, 8 . . . a specimen table,
9 . . . a specimen, 10 . . . a secondary electron detector,
11 . . . an amplifier, 12 . . . an A/D convertor,
13 . . . a memory, 14 . . . an image differentiation part,
15 . . . a memory, 16 . . . an aberration determination part
17 . . . an estimating part for amount of control signal of the device, 18 . . . an aberration correction power control part, 19 . . . a tilt angle control part,
20 . . . an objective excitation control part 20,
21 . . . a D/A converter, 22 . . . a D/A converter,
23 . . . a D/A converter, 30 . . . a standard specimen,
31 . . . a gate valve, 32 . . . a specimen-transport mechanism, 33 . . . a retarding power source,
34 . . . a retarding power source control part,
35 . . . a boosting electrode, 36 . . . a boosting power source electrode control part, 40 . . . a condenser lens,
41 . . . an E×B deflector, 42 . . . a secondary electron convergent lens, 43 . . . a charge-control electrode,
44 . . . a charge-control electrode control part,
45 . . . a charge-control power source,
50 . . . a result-displaying part,
51 . . . a correction-specifying part,
52 . . . an image display,
53 . . . a measuring condition displaying specifying part,
54 . . . a correction-process selection part,
100 . . . a column, 101 . . . a specimen chamber,
102 . . . an image processor, 103 . . . an output unit,
104 . . . a column controller,
105 . . . a specimen preparation chamber,
106 . . . a display

What is claimed is:

1. A charged particle radiation device comprising:
a charged particle optical system including an aberration corrector;
a control means of the charged particle optical system; and
an information processing unit,
wherein the information processing unit generates an aberration correction signal of the aberration corrector to be outputted, captures a plurality of images by causing a beam to scan over a specimen, both a tilt angle and an azimuth angle of the beam being varied, measures an astigmatic difference, an angle, and defocus with respect to the plurality of the images captured, evaluates an aberration amount from these values, and feeds back the evaluated aberration amount to a correction signal amount of the aberration corrector and a control amount of the control means at the time of the next evaluation, respectively, thereby repeats the aberration correction until the evaluated aberration amount reaches a preset target value.

2. The charged particle radiation device according to claim 1, wherein the information processing unit repeats the aberration correction while feeding back the evaluated aberration amount as the control amount of the control means to a control amount of a focus current variation width at the time of focus variation.

3. The charged particle radiation device according to claim 1, wherein the information processing unit repeats the aberration correction while feeding back the evaluated aberration amount as the control amount of the control means to a control amount of the tilt angle.

4. The charged particle radiation device according to claim 1, wherein the information processing unit repeats the aberration correction while feeding back the evaluated aberration amount as the control amount of the control means to a control amount of a focus current variation width at the time of focus variation, and a control amount of the tilt angle.

5. The charged particle radiation device according to claim 1, wherein the information processing unit sets a measuring condition so as to always contain a peak point of the image sharpness between a focus variation minimum value and a focus variation maximum value regardless of the azimuth angle, and additionally, a region where image sharpness on the periphery of the peak undergoes a monotonic decrease, as the measuring condition optimum for measuring those values in the case of finding the astigmatic difference, the angle, and the defocus with respect to the images captured on the basis of a peak value in image sharpness variation.

6. The charged particle radiation device according to claim 1, further comprising a deflector provided above the aberration corrector,
wherein a tilted beam is caused to scan over the specimen by use of the deflector, an incident tilt of the beam against the specimen and an azimuth angle of the beam being varied, shoots an image at a plurality of focus positions, each image being at respective azimuth angles, and measures the astigmatic difference the angle and the defocus from the plurality of the images captured, thereby evaluating the aberration amount from these values.

7. The charged particle radiation device according to claim 6, wherein the information processing unit repeats a step of getting an image captured by causing a beam having a predetermined incident angle against the specimen at a focus position to scan over the specimen, changing the focus position upon completion of getting images under conditions of all the incident angles of the beam, and getting an image again under a condition of a predetermined incident angle against the specimen, thereby getting the image.

8. The charged particle radiation device according to claim 1, further comprising tilt angle adjustment means for adjusting the tilt angle of the beam,
wherein the information processing unit executes calculation of defocus, and astigma, expected to occur at the time of the beam tilting, on the basis of respective values of aberrations remaining in the charged particle optical system, and determines a tilt level of the beam on the basis of results of the calculation, thereby feeding back the tilt level to the tilt angle adjustment means.

9. The charged particle radiation device according to claim 8, wherein the tilt angle adjustment means is a two-stage deflection coil positioned above the aberration corrector.

10. The charged particle radiation device according to claim 8, wherein the tilt angle adjustment means is an electrostatic deflector positioned above the aberration corrector.

11. The charged particle radiation device according to claim 1, further comprising focus position adjustment means for adjusting a focus position of the charged particle optical system,
wherein calculation of the defocus and the astigma, expected to occur at the time of the beam tilting, is executed on the basis of respective values of aberrations remaining in the charged particle optical system, and a plurality of focus positions are determined on the basis of results of the calculation, whereupon the plurality of the focus positions are fed back to the focus position adjustment means.

12. The charged particle radiation device according to claim 11, wherein the focus position adjustment means is an objective lens excitation current.

13. The charged particle radiation device according to claim 11, further comprising a specimen table for holding the specimen,
wherein the focus position adjustment means has a negative voltage applied to the specimen table.

14. The charged particle radiation device according to claim 11,
wherein the charged particle optical system is provided with an objective lens, and an electrostatic lens positioned above the objective lens, and
the focus position adjustment means has a voltage applied to the electrostatic lens.

15. A charged particle radiation device for irradiating a specimen with an aberration-corrected primary charge particle beam, and detecting a secondary electron as generated, thereby outputting a secondary particle signal, the charged particle radiation device comprising:
a charged particle optical system including an aberration corrector;
control means of the charged particle optical system; and
an information processing unit,
wherein a plurality of images are captured by causing the primary charge particle beam to scan over the specimen, an incident tilt of the beam against the specimen and an azimuth angle of the beam being varied, measures an astigmatic difference, an angle, and defocus with respect to each of the plurality of the images captured, evaluates an aberration amount from these values, and repeats processing for feeding back the evaluated aberration amount to the aberration corrector and control of the charged particle optical system at the time of the next evaluation until the evaluated aberration amount reaches a preset target value.

16. The charged particle radiation device according to claim 15,
wherein the information processing unit is provided with a data table for giving information on a relationship among a value of aberration $C_3$, a value of astigma $C_1'$, and a value of defocus $A_1'$,
wherein, at the time of the beam tilting, the information processing unit predicts magnitude of $C_3$ after the next correction on the basis of a value of aberration $C_3$ measured at a tilt angle t and a voltage applied to the aberration corrector in measurement of astigma, and defocus at the time of the beam tilting, and finds a relationship in value between $C_1'$ and $A_1'$, corresponding to the predicted magnitude of $C_3$ from the data table, thereby sets a measuring condition optimum for measuring the $C_1'$ and the $A_1'$.

17. The charged particle radiation device according to claim 16, wherein the information processing unit sets a measuring condition so as to always contain a peak point of the image sharpness between a focus variation minimum value and a focus variation maximum value regardless of an azimuth angle, and additionally, a region where image sharpness on the periphery of the peak undergoes a monotonic decrease, as the measuring condition optimum for measuring those values in the case of finding the $C1'$ and the $A1'$ on the basis of a peak value in image sharpness variation.

18. The charged particle radiation device according to claim 15,
wherein the information processing unit is provided with an image processor and a column controller,
wherein the image processor includes:
an image-capturing part for capturing a plurality of images by causing a beam to scan over a specimen, an incident tilt of the beam against the specimen, and an azimuth angle of the beam being varied;
an analysis part for measuring an astigmatic difference, an angle, and defocus with respect to the plurality of the images captured;
and an aberration coefficient computing part for computing an aberration coefficient from an amount of the astigmatic difference, angle, and an amount of the defocus, obtained by measurement,
wherein the column controller includes:
a determination part for determining necessity of continuing aberration correction on the basis of a relationship between the aberration correction coefficient obtained by the image processor and a target value;
a determination part for measuring condition to determine such measuring condition as to render values of respective aberration coefficients smaller in the case of executing the aberration correction;
a data table for giving information to determine the best aberration-measuring condition; and
an aberration correction processing part for generating a signal on the basis of an output from the determination part for measuring condition.

19. The charged particle radiation device according to claim 18, wherein the aberration correction processing part calculates an output voltage value and a current value of a control power source so as to be fed back as control signals to the aberration corrector, and generates and outputs control signals for a focus current variation width and a tilt angle, respectively, at the time of focus variation.

20. The charged particle radiation device according to claim 15, wherein the information processing unit finds a relationship between a value of aberration $C_3$ and a value of astigma $C_1'$ at the time of the beam tilting, and a relationship between the value of aberration $C_3$, and a value of defocus $A_1'$ at the time of the beam tilting, during measurement of astigma, and defocus, at the time of the beam tilting, by computation on the basis of a relationship expressed in the following equations (9), (10), respectively:

$$C_1' = 2C_3 t^2 \tag{9}$$

$$A_1' = 2C_3 t^2 e^{2i\phi} \tag{10}$$

thereby setting a measuring condition for measuring the $C_1'$ and the $A_1'$ for the next evaluation of the value of aberration $C_3$.

* * * * *